United States Patent
Miyata et al.

(10) Patent No.: US 10,842,027 B2
(45) Date of Patent: Nov. 17, 2020

(54) BASE MATERIAL FOR PRINTED CIRCUIT BOARD AND PRINTED CIRCUIT BOARD

(71) Applicants: SUMITOMO ELECTRIC INDUSTRIES, LTD., Osaka (JP); SUMITOMO ELECTRIC PRINTED CIRCUITS, INC., Shiga (JP)

(72) Inventors: Kazuhiro Miyata, Osaka (JP); Takashi Kasuga, Osaka (JP); Yoshio Oka, Osaka (JP); Hiroshi Ueda, Shiga (JP)

(73) Assignees: SUMITOMO ELECTRIC INDUSTRIES, LTD., Osaka (JP); SUMITOMO ELECTRIC PRINTED CIRCUITS, INC., Shiga (JP)

( * ) Notice: Subject to any disclaimer, the term of this patent is extended or adjusted under 35 U.S.C. 154(b) by 0 days.

(21) Appl. No.: 16/648,391

(22) PCT Filed: Jul. 9, 2018

(86) PCT No.: PCT/JP2018/025838
§ 371 (c)(1),
(2) Date: Mar. 18, 2020

(87) PCT Pub. No.: WO2019/077816
PCT Pub. Date: Apr. 25, 2019

(65) Prior Publication Data
US 2020/0288578 A1    Sep. 10, 2020

(30) Foreign Application Priority Data
Oct. 16, 2017    (JP) .................. 2017-200461

(51) Int. Cl.
*H05K 1/00*    (2006.01)
*H05K 1/09*    (2006.01)
(Continued)

(52) U.S. Cl.
CPC ................. *H05K 3/24* (2013.01); *B22F 1/00* (2013.01); *C22C 1/04* (2013.01); *C23C 28/02* (2013.01);
(Continued)

(58) Field of Classification Search
CPC ............ H05K 3/24; H05K 3/241; H05K 3/38; H05K 3/423; H05K 1/09; B22F 1/00
See application file for complete search history.

(56) References Cited

U.S. PATENT DOCUMENTS

2002/0090497 A1*  7/2002  Kataoka ................. H05K 3/025
                                                            428/209
2004/0191497 A1*  9/2004  Hiraoka ................... H05K 3/38
                                                            428/304.4
(Continued)

FOREIGN PATENT DOCUMENTS

JP    H09-136378    5/1997
JP    2010-272837   12/2010
JP    2016-225524   12/2016

*Primary Examiner* — Hoa C Nguyen
(74) *Attorney, Agent, or Firm* — IPUSA, PLLC

(57) ABSTRACT

A base material for a printed circuit board includes: an insulating base film; a sintered layer that is layered on at least one side surface of the base film and that is formed of a plurality of sintered metal particles; an electroless plating layer that is layered on a surface of the sintered layer that is opposite to the base film; and an electroplating layer that is layered on a surface of the electroless plating layer that is opposite to the sintered layer, wherein an arithmetic mean height Sa of the surface of the electroless plating layer opposite to the sintered layer is greater than or equal to 0.001 µm and less than or equal to 0.5 µm.

7 Claims, 1 Drawing Sheet

(51) Int. Cl.
*H05K 3/24* (2006.01)
*B22F 1/00* (2006.01)
*C22C 1/04* (2006.01)
*C23C 28/02* (2006.01)
*H05K 1/03* (2006.01)
*H05K 3/06* (2006.01)
*H05K 3/38* (2006.01)
*H05K 3/42* (2006.01)

(52) U.S. Cl.
CPC ................ *H05K 1/03* (2013.01); *H05K 1/09* (2013.01); *H05K 3/061* (2013.01); *H05K 3/38* (2013.01); *H05K 3/423* (2013.01)

(56) References Cited

U.S. PATENT DOCUMENTS

| | | |
|---|---|---|
| 2012/0031656 A1 | 2/2012 | Oka et al. |
| 2014/0216799 A1* | 8/2014 | Kawato ................ H05K 3/241 |
| | | 174/257 |
| 2018/0160528 A1* | 6/2018 | Michiwaki ............... H05K 3/14 |

* cited by examiner

BASE MATERIAL FOR PRINTED CIRCUIT BOARD AND PRINTED CIRCUIT BOARD

TECHNICAL FIELD

The present invention relates to a base material for a printed circuit board and a printed circuit board.

The present application is based on and claims priority to Japanese Patent Application No. 2017-200461, filed on Oct. 16, 2017, the entire contents of the Japanese Patent Application are hereby incorporated herein by reference.

BACKGROUND ART

A base material for a printed circuit board is proposed in which a copper thin film layer is layered on a heat-resistant insulating base film without interposing an adhesive layer (see Japanese Laid-open Patent Publication No. H9-136378). In the base material for a printed circuit board substrate described in this publication, the copper thin film layer is formed on both surfaces of the heat-resistant insulating base film using a sputtering method, and a copper thick film layer is formed thereon using an electroplating method.

Also, as a base material for a printed circuit board that can be manufactured at a relatively low cost, one in which a coating layer of a conductive ink containing metal particles is formed on an insulating base material (base film), and a plating layer is further formed on the coating layer is proposed (Japanese Laid-open Patent Publication No. 2010-272837).

PRIOR ART DOCUMENT

Patent Document

[Patent Document 1] Japanese Laid-open Patent Publication No. H9-136378
[Patent Document 2] Japanese Laid-open Patent Publication No. 2010-272837

SUMMARY OF THE INVENTION

According to one aspect of the present invention, a base material for a printed circuit board includes: an insulating base film; a sintered layer that is layered on at least one side surface of the base film and that is formed of a plurality of sintered metal particles; an electroless plating layer that is layered on a surface of the sintered layer that is opposite to the base film; and an electroplating layer that is layered on a surface of the electroless plating layer that is opposite to the sintered layer. In the base material for a printed circuit board, an arithmetic mean height Sa of the surface of the electroless plating layer opposite to the sintered layer is greater than or equal to 0.001 μm and less than or equal to 0.5 μm.

Also, according to another aspect of the present invention, a printed circuit board includes: an insulating base film; a sintered layer that is layered on at least one side surface of the base film and that is formed of a plurality of sintered metal particles; an electroless plating layer that is layered on a surface of the sintered layer that is opposite to the base film; and an electroplating layer that is layered on a surface of the electroless plating layer that is opposite to the sintered layer. In the printed circuit board, the sintered layer, the electroless plating layer, and the electroplating layer are patterned in plan view, and an arithmetic mean height Sa of the surface of the electroless plating layer opposite to the sintered layer is greater than or equal to 0.001 μm and less than or equal to 0.5 μm.

EMBODIMENT FOR CARRYING OUT THE INVENTION

Figure 1:
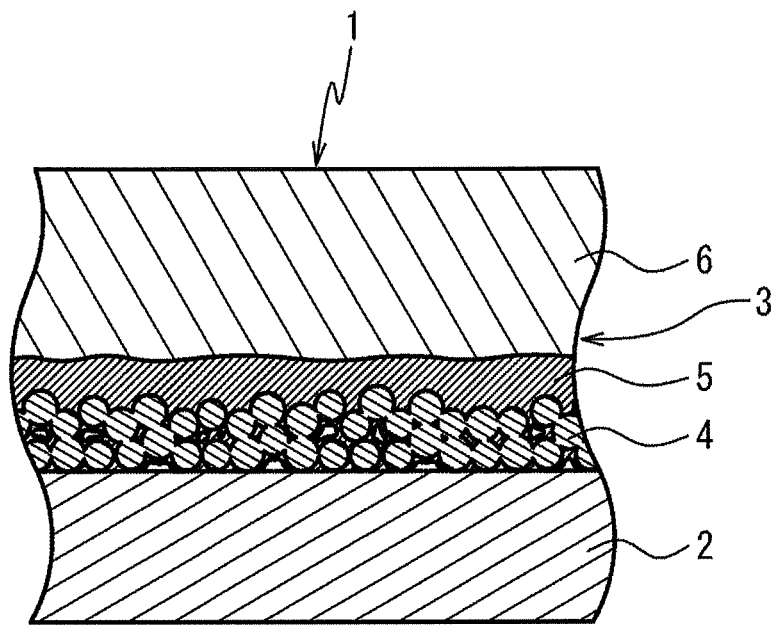
FIG. 1 is a schematic cross-sectional view illustrating a base material for a printed circuit board according to one embodiment of the present invention.

Problem to Be Solved by the Present Disclosure

A base material for a printed circuit board is widely used which includes a metal layer on a surface of an insulating base film and for obtaining a flexible printed circuit board by forming a conductive pattern by etching the metal layer.

In recent years, in accordance with reduction in size and higher performance of electronic devices, higher-density printed circuit boards are demanded. As a base material for a printed circuit board that satisfies the demand for a higher density as described above, a base material for a printed circuit board in which the thickness of a conductive layer is reduced is required.

Also, a base material for a printed circuit board is required to have a high peel strength between the base film and the metal layer so that the metal layer is not peeled from the base film when a bending stress is applied to the flexible printed circuit board.

For the base material for a printed circuit board described in Japanese Laid-open Patent Publication No. H9-136378, because a copper thin film layer is formed on the surface of a heat-resistant base film by sputtering, a vacuum facility is required for manufacturing. For this reason, for the manufacturing facility for the base material for a printed circuit board described in the above publication, the construction cost, the maintenance cost, and the operation cost are relatively high. Also, because the base material for a printed circuit board described in the above publication is manufactured using a vacuum facility, handling of materials and products is complicated, which also increases the manufacturing cost. Further, in a case in which the size of the base material for a printed circuit board described in the above publication is increased, a large-scale vacuum facility is required, and therefore the facility cost is dramatically increased.

In the base material for a printed circuit board described in Japanese Laid-open Patent Publication No. 2010-272837, because voids remain in the coating layer of the conductive ink, the coating layer is easily eroded when forming a conductive pattern by etching. For this reason, in the base material for a printed circuit board described in the above publication, the side etching increases, and disconnection of the conductive pattern easily occurs, and therefore the fineness of the conductive pattern is limited.

Hence, the present disclosure has an object to provide a base material for a printed circuit board and a printed circuit board that can make a conductive pattern finer.

Effect of the Present Disclosure

According to a base material for a printed circuit board according to one aspect of the present invention and a printed circuit board according to another aspect of the present invention, it is possible to make a conductive pattern finer.

Description of Embodiments of the Present Invention

According to one aspect of the present invention, a base material for a printed circuit board includes: an insulating base film; a sintered layer that is layered on at least one side surface of the base film and that is formed of a plurality of sintered metal particles; an electroless plating layer that is layered on a surface of the sintered layer that is opposite to the base film; and an electroplating layer that is layered on a surface of the electroless plating layer that is opposite to the sintered layer. In the base material for a printed circuit board, an arithmetic mean height Sa of the surface of the electroless plating layer opposite to the sintered layer is greater than or equal to 0.001 μm and less than or equal to 0.5 μm.

According to the base material for a printed circuit board, by having the arithmetic mean height Sa of the surface of the electroless plating layer opposite to the sintered layer in the above range, it is possible to prevent formation of voids at the interface between the electroless plating layer and the electroplating layer. Therefore, because side etching at the time of pattern formation can be suppressed, a conductive pattern can be made finer.

In the base material for a printed circuit board, it is preferable that an average particle size of the metal particles is greater than or equal to 1 nm and less than or equal to 500 nm. By the metal particles having an average particle size within the range described above, the dense sintered layer having a low porosity can be relatively easily formed, and the peel strength between the base film and the metal layer can be further enhanced.

In the base material for a printed circuit board, it is preferable that a main component of the sintered layer, the electroless plating layer, and the electroplating layer is copper. By the main component of the sintered layer, the electroless plating layer, and the electroplating layer being copper, it is possible to form a metal layer having a relatively excellent conductivity at low cost.

According to another aspect of the present invention, a printed circuit board includes: an insulating base film; a sintered layer that is layered on at least one side surface of the base film and that is formed of a plurality of sintered metal particles; an electroless plating layer that is layered on a surface of the sintered layer that is opposite to the base film; an electroplating layer that is layered on a surface of the electroless plating layer that is opposite to the sintered layer. In the printed circuit board, the sintered layer, the electroless plating layer, and the electroplating layer are patterned in plan view, and an arithmetic mean height Sa of the surface of the electroless plating layer opposite to the sintered layer is greater than or equal to 0.001 μm and less than or equal to 0.5 μm.

According to the printed circuit board, by having the arithmetic mean height Sa of the surface of the electroless plating layer opposite to the sintered layer in the above range, it is possible to prevent formation of voids at the interface between the electroless plating layer and the electroplating layer. Therefore, because side etching at the time of pattern formation can be suppressed, a conductive pattern can be made finer.

Here, the term "sintering" includes not only making a completely sintered state in which particles are tightly bonded together but also includes a state in which particles are at a stage before reaching a completely sintered state and adhere to each other to form solid bonds. The term "arithmetic mean height Sa" is a value that is measured according to ISO-25178. The term "average particle size" is a particle size at which the volume integrated value is 50% in a particle size distribution measured by a laser diffraction method. The term "main component" is a component whose content by mass is the largest, and is preferably a component whose content is greater than or equal to 90% by mass.

Details of Embodiment of the Present Invention

In the following, each embodiment of a base material for a printed circuit board and a printed circuit board according to the present invention will be described with reference to the drawings.

[Base Material for Printed Circuit Board]

A base material 1 for a printed circuit board illustrated in FIG. 1 includes an insulating base film 2 and a metal layer 3 that is layered on one side surface of the base film 2.

The metal layer 3 is includes a sintered layer 4 that is layered on the one side surface of the base film 2 and that is formed by sintering a plurality of metal particles, an electroless plating layer 5 that is formed on a surface of the sintered layer 4 that is opposite to the base film 2, and an electroplating layer 6 that is layered on a surface of the electroless plating layer 5 that is opposite to the sintered layer 4.

<Base Film>

Examples of a material of the base film 2 that can be used include flexible resins, such as polyimide, liquid-crystal polymers, fluororesins, polyethylene terephthalate, and polyethylene naphthalate; rigid materials, such as phenolic paper, epoxy paper, glass composites, glass epoxy, polytetrafluoroethylene, and glass base materials; rigid-flexible materials in which hard materials and soft materials are combined together, and the like. Among these, polyimide is particularly preferable because of being excellent in mechanical strength and having a large peel strength of the metal layer 3.

The thickness of the base film 2 is set depending on a printed circuit board using the base material for a printed circuit board, and is not particularly limited. For example, the lower limit of the average thickness of the base film 2 is preferably 5 μm, and is more preferably 12 μm. The upper limit of the average thickness of the base film 2 is preferably 2 mm, and is more preferably 1.6 mm. In a case in which the average thickness of the base film 2 is less than the lower limit, the strength of the base film 2 or the base material for a printed circuit board may become insufficient. In a case in which the average thickness of the base film 2 exceeds the upper limit, the base material for a printed circuit board may become unnecessarily thick.

It is preferable to apply a hydrophilic treatment to a surface of the base film 2 on which the sintered layer 4 is layered. Examples of the hydrophilic treatment that can be employed include a plasma treatment by which a surface is irradiated with light to be hydrophilized; and an alkali treatment by which a surface is hydrophilized with an alkali solution. By applying the hydrophilic treatment to the base film 2, the adhesion to the sintered layer 4 can be enhanced and the peel strength of the metal layer 3 can be enhanced. Also, in a case in which the sintered layer 4 is formed by the application and sintering of an ink containing metal particles as described below, because the surface tension of the ink against the base film 2 is reduced, it becomes easy to uniformly apply the ink to the base film 2.

<Sintered Layer>

The sintered layer 4 is formed and layered on the one side surface of the base film 2 by sintering a plurality of metal particles.

(Metal Particles)

As a metal to be a main component of the metal particles that form the sintered layer 4, in order to enhance adhesion between the sintered layer 4 and the base film 2, a metal is preferable such that a metal oxide derived from the metal or a group derived from the metal oxide and a metal hydroxide derived from the metal or a group derived from the metal hydroxide are generated in the vicinity of the interface of the sintered layer 4 with the base film 2 of the base material for a printed circuit board, and copper (Cu), nickel (Ni), aluminum (Al), gold (Au), or silver (Ag) can be used. Among these, copper is particularly preferably used, which is a metal having a good conductivity and excellent in adhesion to the base film 2.

The lower limit of the average particle size of the metal particles in the sintered layer 4 is preferably 1 nm, and is more preferably 30 nm. The upper limit of the average particle size of the metal particles is preferably 500 nm, and is more preferably 200 nm. In a case in which the average particle size of the metal particles is less than the lower limit, for example, due to a decrease in dispersibility and stability of the metal particles in an ink, uniform lamination may not be easily performed on the surface of the base film 2. In a case in which the average particle size of the metal particles exceeds the upper limit, gaps between the metal particles become larger and the porosity of the sintered layer 4 may not be easily reduced.

The sintered layer 4 can be formed by, for example, application and sintering of an ink containing the plurality of metal particles. In this way, by using the ink containing the metal particles, the sintered layer 4 can be formed on the one side surface of the base film 2 easily at a low cost.

The lower limit of the porosity of the area within 500 nm from the interface of the sintered layer 4 with the base film 2 is 1%, and is preferably 2%. The upper limit of the porosity of the area within 500 nm from the interface of the sintered layer 4 with the base film 2 is 50%, is preferably 45%, and is more preferably 20%. In a case in which the porosity of the area within 500 nm from the interface of the sintered layer 4 with the base film 2 is less than the lower limit, sintering is required to be performed at a high temperature for a long time in order to reduce the porosity. This leads to degradation of the base film 2, and therefore the peel strength between the base film 2 and the metal layer 3 may become insufficient. In a case in which the porosity of the area within 500 nm from the interface of the sintered layer 4 with the base film 2 exceeds the upper limit, because the adhesion area between the base film 2 and the sintered layer 4 decreases, the peel strength between the base film 2 and the metal layer 3 may become insufficient.

The lower limit of the average thickness of the sintered layer 4 is preferably 50 nm, and is more preferably 100 nm. The upper limit of the average thickness of the sintered layer 4 is preferably 2 µm, and is more preferably 1.5 µm. In a case in which the average thickness of the sintered layer 4 is less than the lower limit, portions where the metal particles are not present increase in plan view, and the conductivity may decrease. In a case in which the average thickness of the sintered layer 4 exceeds the upper limit, it may become difficult to sufficiently reduce the porosity of the sintered layer 4 and the metal layer 3 may become unnecessarily thick.

In the vicinity of the interface between the base film 2 and the sintered layer 4, the metal oxide derived from the metal of the metal particles or the group derived from the metal oxide (which may be referred to collectively as a "metal oxide or the like"), or the metal hydroxide derived from the metal or the group derived from the metal hydroxide (which may be referred to collectively as a "metal hydroxide or the like") is preferably present. It is particularly preferable that both of the metal oxide and the metal hydroxide are present. This is because the metal oxide or the like and the metal hydroxide or the like are an oxide and a hydroxide that are generated based on the metal particles. The metal oxide or the like and the metal hydroxide or the like have a relatively high adhesion to the base film 2 formed of a resin or the like and to the sintered layer 4 formed of the metal. Thus, the presence of the metal oxide or the like or the metal hydroxide or the like in the vicinity of the interface between the base film 2 and the sintered layer 4 enhances the peel strength between the base film 2 and the sintered layer 4. For example, in a case in which copper is used for the metal particles, copper oxide (CuO) or a group derived from the copper oxide and copper hydroxide ($Cu(OH)_2$) or a group derived from copper hydroxide may be formed and present in the vicinity of the interface between the base film 2 and the sintered layer 4.

The lower limit of the amount of the metal oxide or the like present per unit area in the vicinity of the interface between the base film 2 and the sintered layer 4 is preferably 0.1 µg/cm$^2$, and is more preferably 0.15 µg/cm$^2$. The upper limit of the amount of the metal oxide or the like present per unit area is preferably 10 µg/cm$^2$, is more preferably 5 µg/cm$^2$, and is further more preferably 1 µg/cm$^2$. In a case in which the amount of the metal oxide or the like present per unit area is less than the lower limit, the effect of the metal oxide enhancing the peel strength between the base film 2 and the sintered layer 4 may decrease. In a case in which the amount of the metal oxide or the like present per unit area exceeds the upper limit, it may be difficult to control sintering of the metal particles.

The lower limit of the amount of the metal hydroxide or the like present per unit area in the vicinity of the interface between the base film 2 and the sintered layer 4 is preferably 0.5 µg/cm$^2$, and is more preferably 1.0 µg/cm$^2$. The upper limit of the amount of the metal hydroxide or the like present per unit area is preferably 10 µg/cm$^2$, and is more preferably 5 µg/cm$^2$. In a case in which the amount of the metal hydroxide or the like present per unit area is less than the lower limit, it may be difficult to control sintering of the metal particles for generating a large amount of the metal oxide or the like. In a case in which the amount of the metal hydroxide or the like present per unit area exceeds the upper limit, because the metal oxide or the like is relatively reduced, the peel strength between the sintered layer 4 and the base film 2 may not be enhanced by the metal oxide.

The lower limit of the presence ratio of the amount of the metal oxide or the like present to the amount of the metal hydroxide or the like present in the vicinity of the interface of the base film 2 and the sintered layer 4 is preferably 0.1, and is more preferably 0.2. The upper limit of the presence ratio is preferably 5, is more preferably 3, and is further more preferably 1. In a case in which the presence ratio is less than the lower limit, because the amount of the metal hydroxide or the like is excessively large with respect to the amount of the metal oxide or the like in the vicinity of the interface, the peel strength between the base film 2 and the sintered layer 4 may not be enhanced. In a case in which the presence ratio exceeds the upper limit, it may be difficult to control sintering of the metal particles.

<Electroless Plating Layer>

The electroless plating layer 5 is formed by applying electroless plating to the outer surface of the sintered layer 4. Also, the electroless plating layer 5 is formed to be impregnated with the sintered layer 4. That is, by filling gaps between the metal particles that form the sintered layer 4 with an electroless plating metal, pores inside the sintered layer 4 are reduced. By reducing the pores between the metal particles, it is possible to inhibit the peeling of the sintered layer 4 from the base film 2 due to the pores acting as fracture starting points.

As a metal that is used for the electroless plating, for example, copper, nickel, silver, or the like having a good conductivity can be used, and in a case in which copper is used for the metal particles that form the sintered layer 4, copper is preferably used in view of adhesion to the sintered layer 4. That is, copper is preferable as the main component of the electroless plating layer 5.

In some cases, depending on the conditions of the electroless plating, the electroless plating layer 5 is formed only inside the sintered layer 4. However, the lower limit of the average thickness (not including the thickness of the electroless plating layer inside the sintered layer 4) of the electroless plating layer 5 that is formed on the outer surface of the sintered layer 4 is preferably 0.2 µm, and is more preferably 0.3 µm. The upper limit of the average thickness of the electroless plating layer 5 that is formed on the outer surface of the sintered layer 4 is preferably 1 µm, and is more preferably 0.5 µm. In a case in which the average thickness of the electroless plating layer 5 that is formed on the outer surface of the sintered layer 4 is less than the lower limit, the gaps between the metal particles in the sintered layer 4 are not sufficiently filled with the electroless plating layer 5, and the porosity cannot be sufficiently reduced. Therefore, the peel strength between the base film 2 and the metal layer 3 may become insufficient. Also, when patterning the metal layer 3, side etching may occurs and disconnection may easily occur. On the contrary, in a case in which the average thickness of the electroless plating layer 5 that is formed on the outer surface of the sintered layer 4 exceeds the upper limit, the time required for the electroless plating increases, and the manufacturing cost may unnecessarily increase.

The lower limit of the arithmetic mean height Sa of the surface of the electroless plating layer 5 (that is the surface on which the electroplating layer 6 is layered) opposite to the sintered layer 4 is preferably 0.001 µm, and is more preferably 0.01 µm. The upper limit of the arithmetic mean height Sa of the surface of the electroless plating layer 5 opposite to the sintered layer 4 is preferably 0.5 µm, and is more preferably 0.2 µm. In a case in which the arithmetic mean height Sa of the surface of the electroless plating layer 5 opposite to the sintered layer 4 is less than the lower limit, the thickness of the electroless plating layer 5 may become unnecessarily large for realizing a small arithmetic mean height. In a case in which the arithmetic mean height Sa of the surface of the electroless plating layer 5 opposite to the sintered layer 4 exceeds the upper limit, at the time of layering the electroplating layer 6 on the electroless plating layer 5, voids may occur at the interface between the electroplating layer 6 and the electroless plating layer 5, disconnection of the conductive pattern formed by patterning the metal layer 3 may easily occurs, and it may become difficult to mount an electronic component on the metal layer 3.

<Electroplating Layer>

The electroplating layer 6 is layered on the outer surface side of the sintered layer 4, which is the outer surface of the electroless plating layer 5, by electroplating. Due to the electroplating layer 6, the thickness of the metal layer 3 can be easily and accurately adjusted. Also, by using electroplating, it is possible to increase the thickness of the metal layer 3 in a short time.

As a metal that is used for the electroplating, for example, copper, nickel, silver, or the like having a good conductivity can be used. Among these, copper that is inexpensive and excellent in conductivity is particularly preferable. That is, copper is preferable as the main component of the electroplating layer 6.

The thickness of the electroplating layer 6 is set in accordance with on the type and thickness of a conductive pattern required for a printed circuit board that is formed by using the base material 1 for a printed circuit board, and is not particularly limited. Typically, the lower limit of the average thickness of the electroplating layer 6 is preferably 1 µm, and is more preferably 2 µm. The upper limit of the average thickness of the electroplating layer 6 is preferably 100 µm, and is more preferably 50 µm. In a case in which the average thickness of the electroplating layer 6 is less than the lower limit, the metal layer 3 may be easily damaged. In a case in which the average thickness of the electroplating layer 6 exceeds the upper limit, the base material 1 for a printed circuit board may become unnecessarily thick, and the flexibility of the base material 1 for a printed circuit board may become insufficient.

[Method of Manufacturing Base Material for Printed Circuit Board]

A method of manufacturing the base material for a printed circuit board includes a step of forming metal particles, a step of preparing an ink with the metal particles formed in the metal particle formation step, a step of applying the ink obtained in the ink preparation step to one side surface of the insulating base film 2, a step of sintering coating of the ink formed in the application step, a step of applying electroless plating to the outer surface of the sintered layer 4 formed in the sintering step, and a step of applying electroplating to the outer surface side of the electroless plating layer 5.

<Metal Particle Formation Step>

Examples of a method of forming the metal particles in the metal particle formation step include a high-temperature treatment method, a liquid-phase reduction method, a gas-phase method, and the like. Among these, the liquid-phase reduction method is preferably used in which metal ions are reduced with a reducing agent in an aqueous solution to precipitate metal particles.

A specific method of forming the metal particles by the liquid-phase reduction method can be, for example, a method that includes a reduction step of subjecting metal ions to a reduction reaction with a reducing agent for a certain period of time in a solution obtained by dissolving, in water, a dispersant and a water-soluble metal compound to be an origin of metal ions that form the metal particles.

As the water-soluble metal compound to be the origin of the metal ions, for example, in the case of copper, copper(II) nitrate ($Cu(NO_3)_2$), copper(II) sulfate pentahydrate ($CuSO_4 \cdot 5H_2O$), or the like can be used. Also, in the case of silver, silver(I) nitrate ($AgNO_3$), silver methanesulfonate ($CH_3SO_3Ag$), or the like, in the case of gold, hydrogen tetrachloroaurate(III) tetrahydrate ($HAuCl_4 \cdot 4H_2O$), or the like, can be used. In the case of nickel, nickel(II) chloride hexahydrate ($NiCl_2 \cdot 6H_2O$), nickel(II) nitrate hexahydrate ($Ni(NO_3)_2 \cdot 6H_2O$), or the like can be used. For other metal particles, water-soluble compounds such as chlorides, nitrate compounds, and sulfate compounds can also be used.

As the reducing agent in a case in which metal particles are formed by the liquid-phase reduction method, various reducing agents capable of reducing and precipitating the metal ions in the reaction system of a liquid phase (aqueous solution) can be used. Examples of the reducing agent include sodium borohydride, sodium hypophosphite, hydrazine, transition metal ions such as trivalent titanium ions and divalent cobalt ions, ascorbic acid, reducing sugars such as glucose and fructose, polyhydric alcohols such as ethylene glycol and glycerol, and the like.

Among these, a method in which metal ions are reduced to precipitate metal particles by redox action when trivalent titanium ions are oxidized to tetravalent titanium ions is a titanium redox method. Metal particles that are obtained by the titanium redox method have small and uniform particle sizes and have a shape similar to a spherical shape. Therefore, it is possible to form a dense layer of metal particles and to easily reduce the pores of the sintered layer 4.

To adjust the particle sizes of the metal particles, the types and the mixing ratio of the metal compound, the dispersant, and the reducing agent may be adjusted, and the stirring rate, the temperature, the time, the pH, and the like in the reduction step of subjecting the metal compound to a reduction reaction may be adjusted.

In particular, the lower limit of the temperature in the reduction step is preferably 0° C., and is more preferably 15° C. The upper limit of the temperature in the reduction step is preferably 100° C., is more preferably 60° C., and is further more preferably 50° C. In a case in which the temperature in the reduction step is lower than the lower limit, the reduction reaction efficiency may be insufficient. In a case in which the temperature in the reduction step exceeds the upper limit, the growth rate of the metal particles is large and the particle sizes may not be easily adjusted.

To obtain metal particles having small particle sizes as in the present embodiment, the pH of the reaction system in the reduction step is preferably greater than or equal to 7 and less than or equal to 13. At this time, by using a pH modifier, it is possible to adjust the pH of the reaction system in the range described above. Examples of the pH modifier that can be used include common acids and alkalis, such as hydrochloric acid, sulfuric acid, sodium hydroxide, and sodium carbonate. In particular, to prevent the degradation of peripheral members, nitric acid and ammonia, which does not contain impurity elements such as alkali metals, alkaline-earth metals, halogen elements such as chlorine, sulfur, phosphorus, and boron, are preferable.

<Ink Preparation Step>

In the ink preparation step, an ink containing the metal particles that form the sintered layer 4 is prepared. As the ink containing the metal particles, an ink containing a dispersion medium for the metal particles and a dispersant that uniformly disperses the metal particles in the dispersion medium is preferably used. By using the ink in which the metal particles are uniformly dispersed, it is possible to uniformly attach the metal particles to the surface of the base film 2, and it is possible to form a uniform sintered layer 4 on the surface of the base film 2.

Although the dispersant that is contained in the ink is not particularly limited, a polymeric dispersant whose molecular weight is greater than or equal to 300 and less than or equal to 300,000 is preferably used. By using the polymeric dispersant having a molecular weight within the range described above, it is possible to disperse the metal particles satisfactorily in the dispersion medium, and it is possible to make the film quality of the obtained sintered layer 4 dense and defect-free. In a case in which the molecular weight of the dispersant is less than the lower limit, the effect of preventing the aggregation of the metal particles to maintain the dispersion may not be sufficiently obtained. As a result, a dense sintered layer having few defects may not be layered on the base film 2. In a case in which the molecular weight of the dispersant exceeds the upper limit, the dispersant may become excessively bulky, and in the sintering step after applying the ink, sintering of the metal particles may be inhibited and voids may be generated. Also, when the dispersant is excessively bulky, the denseness of the film quality of the sintered layer 4 may be decreased, and the decomposition residues of the dispersant may decrease the conductivity.

It is preferable that the dispersant does not contain sulfur, phosphorus, boron, halogens, and alkalis in terms of preventing the degradation of components. Preferable examples of the dispersant, having a molecular weight within the range described above, include amine-based polymeric dispersants such as polyethyleneimine and polyvinylpyrrolidone; hydrocarbon-based polymeric dispersants having a carboxylic acid group in its molecule, such as polyacrylic acid and carboxymethyl cellulose; polymeric dispersants having a polar group, such as Poval (polyvinyl alcohol), styrene-maleic acid copolymers, olefin-maleic acid copolymers, and copolymers having a polyethyleneimine moiety and a polyethylene oxide moiety in one molecule thereof.

The dispersant can also be added to the reaction system in a state of a solution dissolved in water or a water-soluble organic solvent. The content of the dispersant is preferably greater than or equal to 1 part by mass and less than or equal to 60 parts by mass per 100 parts by mass of the metal particles. Although the dispersant surrounds the metal particles to prevent aggregation of the metal particles, and satisfactorily disperses the metal particles, in a case in which the content of the dispersant is less than the lower limit, the effect of preventing the aggregation may become insufficient. In a case in which the content of the dispersant exceeds the upper limit, in the sintering step after applying the ink, an excessive dispersant may inhibit sintering of the metal particles and voids may be generated. Further, the decomposition residues of the polymeric dispersant may remain as impurities in the sintered layer to decrease the conductivity.

The content of water to be a dispersion medium in the ink is preferably greater than or equal to 20 parts by mass and less than or equal to 1,900 parts by mass per 100 parts by mass of the metal particles. Although water as the dispersion medium sufficiently swells the dispersant to satisfactorily disperse the metal particles surrounded by the dispersant, in a case in which the content of water is less than the lower limit, the effect by water of swelling the dispersant may become insufficient. In a case in which the content of water exceeds the upper limit, the proportion of the metal particles in the ink is small, and it may be impossible to form a satisfactory sintered layer having a necessary thickness and density on the surface of the base film 2.

As an organic solvent contained in the ink as needed, various water-soluble organic solvents can be used. Specific examples thereof include alcohols such as methyl alcohol, ethyl alcohol, n-propyl alcohol, isopropyl alcohol, n-butyl alcohol, isobutyl alcohol, sec-butyl alcohol, and tert-butyl alcohol; ketones such as acetone and methyl ethyl ketone; polyhydric alcohols such as ethylene glycol and glycerin, and other esters; glycol ethers such as ethylene glycol monoethyl ether and diethylene glycol monobutyl ether, and the like.

The content of the water-soluble organic solvent is preferably greater than or equal to 30 parts by mass and less than or equal to 900 parts by mass per 100 parts by mass of the metal particles. In a case in which the content of the water-soluble organic solvent is less than the lower limit, the effect by the organic solvent of adjusting the viscosity and adjusting the vapor pressure of the dispersion liquid may not be sufficiently obtained. In a case in which the content of the water-soluble organic solvent exceeds the upper limit, the effect by water of swelling the dispersant may be insufficient, and aggregation of the metal particles in the ink may occur.

It should be noted that in the case of manufacturing the metal particles by the liquid-phase reduction method, the metal particles precipitated in a liquid-phase reaction system (aqueous solution) can be prepared by using an ink that has been made into a powder through steps of filtration, washing, drying, disintegration, and the like. In this case, the powdery metal particles, water that is a dispersion medium, a dispersant, and, optionally, a water-soluble organic solvent can be mixed at predetermined proportions to prepare the ink containing the metal particles. However, it is preferable to prepare the ink with a liquid phase (aqueous solution), in which the metal particles have been precipitated, as a starting material. Specifically, the liquid phase (aqueous solution) containing the precipitated metal particles is subjected to treatment, such as ultrafiltration, centrifugal separation, washing with water, or electrodialysis, to remove impurities and, optionally, is concentrated to remove water. Alternatively, after water is added to adjust the concentration of the metal particles, and, optionally, a water-soluble organic solvent is further added at a predetermined proportion, thereby preparing the ink containing the metal particles. By this method, it is possible to prevent generation of coarse and irregular particles due to aggregation at the time of drying the metal particles, and it is easy to form a dense and uniform sintered layer 4.

<Application Step>

In the application step, the ink is applied to one side surface of the base film 2. As a method of applying the ink, for example, a known coating method, such as a spin coating method, a spray coating method, a bar coating method, a die coating method, a slit coating method, a roll coating method, or a dip coating method, can be used. Also, the ink may be applied to only part of one side surface of the base film 2 by screen printing or with a dispenser or the like.

<Sintering Step>

In the sintering step, the ink applied on one side surface of the base film 2 is preferably dried and then sintered by a heat treatment. Thereby, the dispersant in the solvent of the ink is evaporated or thermally decomposed, the remaining metal particles are sintered, and the sintered layer 4 fixed on one side surface of the base film 2 is obtained.

Also, in the vicinity of the interface of the sintered layer 4 with the base film 2, the metal particles are oxidized at the time of sintering, while suppressing generation of a metal hydroxide derived from the metal of the metal particles or a group derived from the metal hydroxide, a metal oxide derived from the metal or a group derived from the metal oxide is generated. Specifically, for example, in a case in which copper is used for metal particles, although copper oxide and copper hydroxide are generated in the vicinity of the interface of the sintered layer 4 with the base film 2, the amount of generated copper oxide is larger. Because the copper oxide generated in the vicinity of the interface of the sintered layer 4 is strongly bonded to polyimide constituting the base film 2, the peel strength between the base film 2 and the sintered layer 4 increases.

The sintering is preferably performed in an atmosphere containing a certain amount of oxygen. The lower limit of the oxygen concentration in the atmosphere at the time of sintering is preferably 1 ppm by volume, and is more preferably 10 ppm by volume. The upper limit of the oxygen concentration is preferably 10,000 ppm by volume, and is more preferably 1,000 ppm by volume. In a case in which the oxygen concentration is less than the lower limit, the amount of copper oxide generated in the vicinity of the interface of the sintered layer 4 may be small, and the adhesion between the base film 2 and the sintered layer 4 may not be sufficiently enhanced. In a case in which the oxygen concentration exceeds the upper limit, the metal particles may be excessively oxidized, and the conductivity of the sintered layer 4 may decrease.

The lower limit of the sintering temperature is preferably 150° C., and is more preferably 200° C. The upper limit of the sintering temperature is preferably 500° C., and is more preferably 400° C. In a case in which the sintering temperature is lower than the lower limit, the amount of copper oxide generated in the vicinity of the interface of the sintered layer 4 may be small, and the adhesion between the base film 2 and the sintered layer 4 may not be sufficiently enhanced. In a case in which the sintering temperature exceeds the upper limit and the base film 2 is an organic resin such as polyimide, the base film 2 may deform.

<Electroless Plating Step>

In the electroless plating step, on a surface of the sintered layer 4 layered on one surface the base film 2 in the sintering step that is opposite to the base film 2, electroless plating is applied to form the electroless plating layer 5.

It should be noted that the electroless plating is preferably performed together with treatment such as a cleaner step, a water-washing step, an acid treatment step, a water-washing step, a pre-dip step, an activator step, a water-washing step, a reduction step, and a water-washing step.

Also, it is preferable to further perform heat treatment after the electroless plating layer 5 is formed by the electroless plating. By applying the heat treatment after forming the electroless plating layer 5, the metal oxide or the like in the vicinity of the interface of the sintered layer 4 with the base film 2 is further increased, and the adhesion between the base film 2 and the sintered layer 4 is further increased. The temperature and the oxygen concentration in the heat treatment after the electroless plating can be similar to the sintering temperature and the oxygen concentration in the sintering step.

<Electroplating Step>

In the electroplating step, the electroplating layer 6 is layered on the outer surface of the electroless plating layer 5 by electroplating. In the electroplating step, the entire thickness of the metal layer 3 is increased to a desired thickness.

The electroplating can be performed, for example, using a known electroplating bath corresponding to a plating metal such as copper, nickel, or silver, and selecting appropriate conditions in such a manner that the metal layer 3 having a desired thickness is promptly formed without defects.

[Advantage]

According to the base material 1 for a printed circuit board, by having the arithmetic mean height Sa of the surface of the electroless plating layer 5 opposite to the sintered layer 4 in the above range, gaps between the metal particles of the sintered layer 4 are filled with the electroless plating metal, and suppress of formation of voids at the interface between the electroless plating layer 5 and the electroplating layer 6 can be suppressed. Therefore, according to the base material 1 for a printed circuit board, because side etching at the time of forming a conductive pattern can be suppressed, the conductive pattern can be made finer.

Also, the base material 1 for a printed circuit board can be manufactured without any special facility such as a vacuum facility, and thus can be manufactured at a relatively low cost despite that the peel strength between the base film 2 and the metal layer 3 is large.

[Printed Circuit Board]

The printed circuit board is formed with a subtractive method or a semi-additive method using the base material 1 for a printed circuit board illustrated in FIG. 1. More specifically, the printed circuit board is manufactured by forming a conductive pattern with the subtractive method or the semi-additive method using the metal layer 3 of the base material 1 for a printed circuit board. That is, in the printed circuit board, at least a part of the conductive pattern is formed by patterning the metal layer 3 of the base material 1 for a printed circuit board of FIG. 1 in plan view.

In the subtractive method, a film of a photosensitive resist is formed on one surface side of (the metal layer 3 side) of the base material 1 for a printed circuit board illustrated in FIG. 1. The resist is patterned so as to correspond to a conductive pattern by exposure, development, and the like. Subsequently, a portion of the metal layer 3 other than the conductive pattern is removed by etching with the patterned resist as a mask. Finally, by removing the remaining resist, the printed circuit board including the conductive pattern formed of the remaining portion of the metal layer 3 of the base material 1 for a printed circuit board is obtained.

Figure 2:
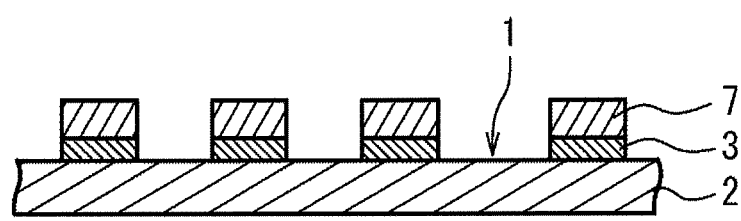
FIG. 2 is a schematic cross-sectional view illustrating a printed circuit board according to one embodiment of the present invention.

In the semi-additive method, a film of a photosensitive resist is formed on one surface side of the base material 1 for a printed circuit board illustrated in FIG. 1. The resist is patterned by exposure, development, and the like to form an opening corresponding to a conductive pattern. Subsequently, a conductive layer is selectively layered by plating with the patterned resist as a mask using the metal layer 3 exposed in the opening of the mask as a seed layer. After the resist is peeled off, a surface of the conductive layer and a portion of the metal layer 3 where the conductive layer is not formed are removed by etching. Thereby, as illustrated in FIG. 2, the printed circuit board is obtained including the conductive pattern in which a conductive layer 7 is further layered on the remaining portion of the metal layer 3 of the base material 1 for a printed circuit board.

[Advantage]

Because the printed circuit board is manufactured by using the base material 1 for a printed circuit board, the conductive pattern can be made finer.

Also, because the printed circuit board is formed by a common subtractive method or a semi-additive method using the inexpensive base material 1 for a printed circuit board and thus can be manufactured at a low cost.

Other Embodiments

The embodiments disclosed above should be considered exemplary in all respects and not limiting. The scope of the present invention is not limited to configurations of the above described embodiments, but is indicated by claims and is intended to include all changes within the meaning and scope of equivalence with the claims.

A metal layer may be formed on each surface of the base film.

Also, the sintered layer of the base material for a printed circuit board may be formed by layering and sintering the metal particles on a surface of the base film using another means without using an ink.

Examples

Although the present invention will be described in detail with reference to Examples, the present invention is not limited to the description of Examples.

<Prototypes of Base Materials for Printed Circuit Boards>

In order to verify effects, No. 1 to No. 8 of base materials for printed circuit boards were manufactured with different manufacturing conditions.

(No. 1 of Base Material for Printed Circuit Board)

First, copper particles having an average particle size of 75 nm were used as metal particles and dispersed in water of a solvent to prepare an ink having a copper concentration of 26% by mass. Next, using a polyimide film ("Kapton EN-S", manufactured by Du Pont-Toray Co., Ltd.) having an average thickness of 12 μm as an insulating base film, the ink was applied to both surfaces of the polyimide film, and the polyimide film was dried in air and dry coatings having an average thickness of 0.15 μm were formed. Subsequently, the polyimide film on which the dry coatings were formed was sintered at 350° C. for 30 minutes in a nitrogen atmosphere having an oxygen concentration of 10 ppm by volume to form a sintered layer. Then, electroless plating of copper was performed on the surface of the sintered layer opposite to the base film to form an electroless plating layer having an average thickness of 0.3 μm from the outer surface of the sintered layer. Further, a heat treatment was performed at 350° C. for 2 hours in a nitrogen atmosphere having an oxygen concentration of 150 ppm by volume. By performing electroplating on No. 1 of the substrate for a base material prepared as described above, an electroplating layer was formed such that the average thickness of the entire metal layer was 18 μm, and No. 1 of the base material for a printed circuit board was obtained.

(No. 2 of Base Material for Printed Circuit Board)

With the exception of using "APICAL NPI" manufactured by Kaneka Corporation instead of "Kapton EN-S" as an insulating base film, by a method similar to that of No. 1 of the substrate for a base material and No. 1 of the base material for a printed circuit board described above, No. 2 of a substrate for a base material and No. 2 of a base material for a printed circuit were obtained.

(No. 3 of Base Material for Printed Circuit Board)

With the exception of using "UPILEX SGA" manufactured by Ube Industries, Ltd. instead of "Kapton EN-S" as an insulating base film, by a method similar to that of No. 1 of the substrate for a base material and No. 1 of the base material for a printed circuit board described above, No. 3 of a substrate for a base material and No. 3 of a base material for a printed circuit were obtained.

(No. 4 of Base Material for Printed Circuit Board)

With the exception the average particle size of metal particles was 150 nm and a dry coating having an average thickness of 0.3 μm was formed, by a method similar to that of No. 1 of the substrate for a base material and No. 1 of the base material for a printed circuit board described above, No. 4 of a substrate for a base material and No. 4 of a base material for a printed circuit were obtained.

(No. 5 of Base Material for Printed Circuit Board)

With the exception of using metal particles having an average particle size of 30 nm, by a method similar to that of No. 1 of the substrate for a base material and No. 1 of the base material for a printed circuit board described above, No. 5 of a substrate for a base material and No. 5 of a base material for a printed circuit were obtained.

(No. 6 of Base Material for Printed Circuit Board)

With the exception of forming an electroless plating layer having an average thickness of 0.5 μm from the outer surface of the sintered layer, by a method similar to that of No. 1 of the substrate for a base material and No. 1 of the base material for a printed circuit board described above, No. 6 of a substrate for a base material and No. 6 of a base material for a printed circuit were obtained.

(No. 7 of Base Material for Printed Circuit Board)

With the exception that the average particle size of metal particles was 600 nm and a dry coating having an average thickness of 1.4 μm of dry coating was formed, by a method similar to that of No. 1 of the substrate for a base material and No. 1 of the base material for a printed circuit board described above, No. 7 of a substrate for a base material and No. 7 of a base material for a printed circuit were obtained.

(Prototype No. 8 of Base Material for Printed Circuit Board)

With the exception that the average particle size of metal particles was 400 nm, a dry coating having an average thickness of 1.0 μm of dry coating was formed, and an electroless plating layer having an average thickness of 0.05 μm from the outer surface of the sintered layer was formed, by a method similar to that of No. 1 of the substrate for a base material and No. 1 of the base material for a printed circuit board described above, No. 8 of a substrate for a base material and No. 8 of a base material for a printed circuit were obtained.

For each of No. 1 to No. 8 of the substrates for base materials, the arithmetic mean height Sa of the surface of the electroless plating layer opposite to the sintered layer was measured using "VK-X160" manufactured by Keyence Corporation.

For each of No. 1 to No. 8 of the substrates for base materials, a cross section was observed with an electron microscope to determine whether voids were generated between the electroless plating layer and the electroplating layer.

Table 1 indicates the arithmetic mean height Sa of each of No. 1 to No. 8 of the substrates for base materials and the presence/absence of voids between the electroless plating layer and the electroplating layer of each of No. 1 to No. 8 of the substrates for base materials.

TABLE 1

| No. | ARITHMETIC MEAN HEIGHT Sa [μm] | VOID |
| --- | --- | --- |
| No. 1 | 0.07 | NOT PRESENT |
| No. 2 | 0.06 | NOT PRESENT |
| No. 3 | 0.07 | NOT PRESENT |
| No. 4 | 0.17 | NOT PRESENT |
| No. 5 | 0.04 | NOT PRESENT |
| No. 6 | 0.05 | NOT PRESENT |
| No. 7 | 0.60 | PRESENT |
| No. 8 | 0.70 | PRESENT |

For each of No. 1 to No. 6 of the substrates for base materials, the arithmetic mean height Sa of the surface of the electroless plating layer opposite to the sintered layer was small and voids were not present between the electroless plating layer and the electroplating layer. Therefore, even when a conductive pattern that is formed by patterning a metal layer is made finer, the possibility that disconnection of the conductive pattern occurs is considered to be small. In contrast, for each of No. 7 and No. 8 of the substrates for base materials, the arithmetic mean height Sa of the surface of the electroless plating layer opposite to the sintered layer was large and voids were formed between the electroless plating layer and the electroplating layer. Therefore, when a conductive pattern that is formed by patterning a metal layer is made finer, the possibility that disconnection of the conductive pattern occurs is considered to be large.

DESCRIPTION OF THE REFERENCE NUMERALS 1 base material for a printed circuit board
2 base film
3 metal layer
4 sintered layer
5 electroless plating layer
6 electroplating layer
7 conductive layer

The invention claimed is:

1. A base material for a printed circuit board comprising:
an insulating base film;
a sintered layer that is layered on at least one side surface of the base film and that is formed of a plurality of sintered metal particles;
an electroless plating layer that is layered on a surface of the sintered layer that is opposite to the base film; and
an electroplating, layer that is layered on a surface of the electroless plating layer that is opposite to the sintered layer,
wherein an arithmetic mean height Sa of the surface of the electroless plating layer on which the electroplating layer is layered and at which the electroless plating layer is in contact with the electroplating layer is greater than or equal to 0.001 μm and less than or equal to 0.5 μm.

2. The base material for a printed circuit board according to claim 1 wherein an average particle size of the metal particles is greater than or equal to 1 nm and less than or equal to 500 nm.

3. The base material for a printed circuit board according to claim 1, wherein a main component of the sintered layer, the electroless plating layer, and the electroplating layer is copper.

4. The base material for a printed circuit board according to claim wherein the arithmetic mean height Sa is less than or equal to 0.20 μm.

5. The base material for a printed circuit board according to claim 1. wherein the arithmetic mean height Sa is less than or equal to 0.20 μm.

6. The base material for a printed circuit board according to claim 1, wherein the arithmetic mean height Sa is greater than or equal to 0.04 μm and loss than or equal to 0.17 μm.

7. A printed circuit board comprising:
an insulating base film;
a sintered layer that is layered on at least one side surface of the base film and that is formed of a plurality of sintered metal particles;
an electroless plating layer that is layered on a surface of the sintered layer that is opposite to the base film;

an electroplating layer that is layered on a surface of the electroless plating layer that is opposite to the sintered layer, wherein the sintered layer, the electroless plating layer, and the electroplating layer are patterned in plan view, and wherein an arithmetic mean height Sa of the surface of the electroless plating layer on which the electroplating layer is layered and at which the electroless plating layer is in contact with the electroplating layer is greater than or equal to 0.001 μm and less than or equal to 0.5 μm.

* * * * *